(12) United States Patent
Derat et al.

(10) Patent No.: US 11,698,401 B1
(45) Date of Patent: Jul. 11, 2023

(54) METHOD OF SIMULATING AN EFFECT OF INTERACTIONS BETWEEN A DEVICE UNDER TEST AND A SCATTERING OBJECT AND HYBRID OTA TEST SYSTEM

(71) Applicant: Rohde & Schwarz GmbH & Co. KG, Munich (DE)

(72) Inventors: Benoit Derat, Munich (DE); Mert Celik, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/592,747

(22) Filed: Feb. 4, 2022

(51) Int. Cl.
*G01R 27/32* (2006.01)
*G01R 29/08* (2006.01)
*G01R 29/10* (2006.01)

(52) U.S. Cl.
CPC ....... *G01R 29/0892* (2013.01); *G01R 29/105* (2013.01)

(58) Field of Classification Search
CPC .. G01R 29/10; G01R 29/105; G01R 29/0814; G01R 29/0821; G01R 29/0878; G01R 29/0892; G01R 29/0871; G01R 31/001; G01R 1/0018
See application file for complete search history.

(56) References Cited

U.S. PATENT DOCUMENTS

| | | | |
|---|---|---|---|
| 8,103,470 B2 * | 1/2012 | Teshirogi | H01Q 19/13 |
| | | | 702/76 |
| 8,531,343 B1 * | 9/2013 | Henrie | G01R 29/105 |
| | | | 343/703 |
| 2002/0039030 A1 | 4/2002 | Khazei | |
| 2007/0024293 A1 | 2/2007 | Kosaka et al. | |

(Continued)

OTHER PUBLICATIONS

Derat, B. et al., "Base Station Specific Absorption Rate Assessment Based on a Combination of Over-The-Air Measurements and Full-Wave Electromagnetic Simulations," 2021 Antenna Measurement Techniques Association Symposium (AMTA), 2021, pp. 1-6.

(Continued)

*Primary Examiner* — Thang X Le
(74) *Attorney, Agent, or Firm* — Christensen O'Connor Johnson Kindness PLLC

(57) ABSTRACT

A method of simulating an effect of interactions between a device under test and a scattering object by of a hybrid over-the-air (OTA) test system is described. The method includes the steps of determining at least one radiation parameter of the device under test, wherein the at least one radiation parameter is associated with electromagnetic waves emitted by the device under test; determining an equivalent source on a Huygens surface based on the at least one determined radiation parameter, wherein the equivalent source is associated with the device under test; assigning material properties to a Huygens box confined by the Huygens surface, wherein the material properties are associated with at least one of reflection of electromagnetic waves and absorption of electromagnetic waves; and simulating an electromagnetic interaction between the device under test and the scattering object based on the determined equivalent source and based on the assigned material properties.

20 Claims, 3 Drawing Sheets

(56) References Cited

U.S. PATENT DOCUMENTS

| | | | |
|---|---|---|---|
| 2010/0109956 A1* | 5/2010 | Peng | G01R 29/10 |
| | | | 343/703 |
| 2010/0285753 A1 | 11/2010 | Foegelle | |
| 2013/0002275 A1 | 1/2013 | Min et al. | |
| 2014/0141727 A1* | 5/2014 | Kildal | H04B 17/15 |
| | | | 455/67.12 |
| 2019/0162780 A1* | 5/2019 | Danz | H04B 17/29 |
| 2019/0391195 A1* | 12/2019 | Kvarnstrand | H04B 17/15 |

OTHER PUBLICATIONS

Derat, B. et al., "Evaluation of Integrated Antenna Performance through Combined Use of Measurement and Full-Wave Simulation," 2020 Antenna Measurement Techniques Association Symposium (AMTA), 2020, pp. 1-5.

Wong, A.M.H., "Active Huygens' Box: Arbitrary Electromagnetic Wave Generation With an Electronically Controlled Metasurface," in IEEE Transactions on Antennas and Propagation, vol. 69, No. 3, pp. 1455-1468, Mar. 2021.

* cited by examiner

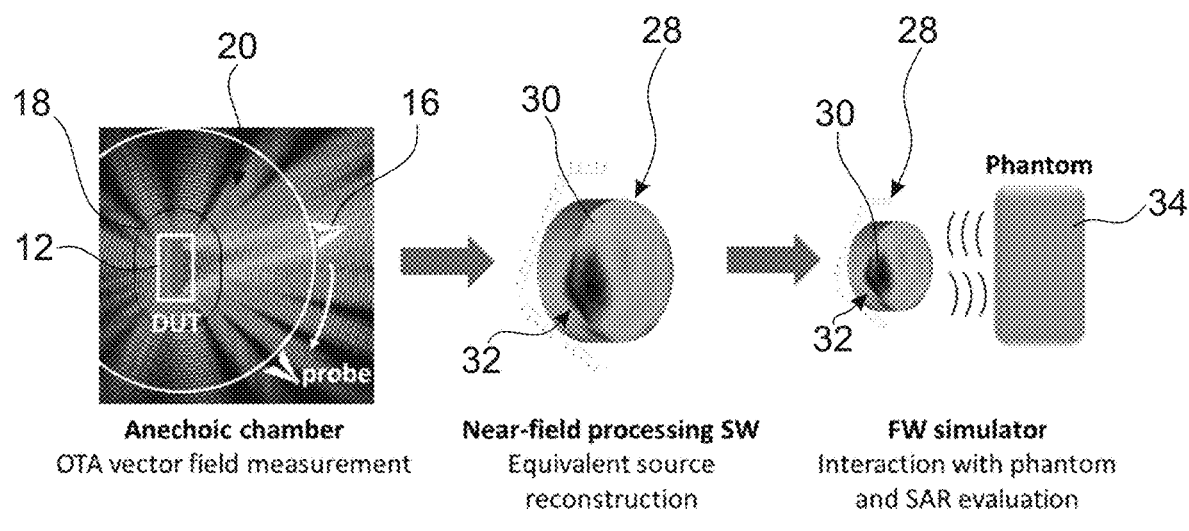

METHOD OF SIMULATING AN EFFECT OF INTERACTIONS BETWEEN A DEVICE UNDER TEST AND A SCATTERING OBJECT AND HYBRID OTA TEST SYSTEM

FIELD OF THE DISCLOSURE

Embodiments of the present disclosure provide a method of simulating an effect of interactions between a device under test and a scattering object by a hybrid over-the-air (OTA) test system. Embodiments of the present disclosure further provide a hybrid over-the-air (OTA) test system.

BACKGROUND

With increasing complexity of modern wireless communication devices, it is becoming increasingly more important to test a large variety of different application scenarios in order to ensure a correct functionality of an electronic device under test.

However, performing tests for all the different application scenarios is time-consuming and rather expensive, as the device under test has to be tested with a plurality of different objects in the environment of the device under test.

In the technical field of OTA testing, hybrid approaches between performing actual OTA measurements and simulations are known.

In these hybrid approaches, certain OTA measurements are performed in order to test the transmission properties of a device under test in an undisturbed environment.

Based on the conducted measurements, simulations of the device under test in different environments are performed, wherein the interaction of the device under test with further objects, such as further electronic devices or with biological material, is simulated.

However, currently available hybrid approaches may still not correctly capture the full interaction of a device under test with other objects. In some embodiments, the existing methods become inaccurate if the objects are located rather close to the device under test.

Thus, there is a need for a method of simulating an effect of interactions between a device under test and a scattering object, and for a hybrid OTA test system that allow for a more precise assessment of interactions of the device under test with other objects.

SUMMARY

Embodiments of the present disclosure provide a method of simulating an effect of interactions between a device under test and a scattering object by a hybrid over-the-air (OTA) test system. The hybrid OTA test system comprises an analysis circuit and a simulation circuit. In an embodiment, the method comprises the steps of:

Determining, by the analysis circuit, at least one radiation parameter of the device under test, wherein the at least one radiation parameter is associated with electromagnetic waves emitted by the device under test; Determining, by the simulation circuit, an equivalent source on a Huygens surface based on the at least one determined radiation parameter, wherein the equivalent source is associated with the device under test;

Assigning, by the simulation circuit, material properties to a Huygens box confined by the Huygens surface, wherein the material properties are associated with reflection of electromagnetic waves and/or absorption of electromagnetic waves; and Simulating, by the simulation circuit, an electromagnetic interaction between the device under test and the scattering object based on the determined equivalent source and based on the assigned material properties, thereby simulating an effect of interactions between the device under test and the scattering object.

Therein and in the following, it is to be understood that the at least one radiation parameter may be determined based on actual OTA measurements of the device under test. For example, electromagnetic waves emitted by the device under test are received via suitable antennas. The analysis circuit may receive the electromagnetic waves or representatives thereof and, additionally, the analysis circuit may analyze the received electromagnetic waves or rather the representatives thereof in order to determine the at least one radiation parameter.

On the other hand, the equivalent source is a mathematical object that may be determined based on a physical model of the device under test. In general, the equivalent source is determined such that (simulated) electromagnetic waves emitted by the equivalent source are the same as the actual electromagnetic waves emitted by the device under test, at least in a region outside of the device under test.

Accordingly, a hybrid OTA test method is provided that involves both actual OTA measurements and simulations of interactions of the device under test with at least one further object, namely the scattering object.

In the state of the art, the device under test is usually simulated as a mere signal source, such that absorption properties and reflection properties of the device under test are not taken into consideration for the simulation. In other words, in the state of the art the Huygens box is transparent to electromagnetic waves such that the Huygens box does not reflect or absorb electromagnetic waves.

With the method according to embodiments of the present disclosure, a more realistic simulation of the device under test in a certain environment comprising the scattering object is provided, as the reflection properties and/or absorption properties of the device under test are accounted for by the simulated material properties of the Huygens box.

In other words, while the device under test is treated as a box that is transparent to electromagnetic waves in the state of the art, the method according to embodiments of the present disclosure allow for a realistic simulation of the interactions between the device under test and the scattering object.

For example, the scattering object may be an object in the environment of the device under test, such as a car or another vehicle, certain components of a car or of another vehicle, a tree or other plants, a building, a mountain, etc.

As a further example, the scattering object may correspond to biological material. For example, the scattering object may be a human or a certain body part of a human, for example a human head.

Thus, a realistic simulation of an interaction of the device under test with biological material matter is provided, for example of the absorption of electromagnetic waves generated by the device under in the biological material.

For example, with a method according to one or more embodiments of the present disclosure, the electromagnetic exposure of a person standing nearby a low-power indoor cell can be evaluated with high precision based on OTA measurements without actually exposing a human to the electromagnetic waves. This is achieved by measuring a base station of the low-power indoor cell in free space or in an OTA chamber and then simulating the presence of a human body or mannequin in order to calculate the fields inside the body.

Accordingly, the method allows for a realistic simulation and thus for precise assessment of the radiation energy absorbed by the biological material, for example by the human body.

According to an aspect of the present disclosure, the Huygens surface has a defined arbitrary surface geometry. The Huygens surface may be a surface that is closely surrounding the device under test. In some embodiments, the Huygens surface may have a similar shape or the same shape as an outer surface of the device under test. Thus, the equivalent source closely resembles the device under test, such that a realistic simulation of the device under test is provided by the equivalent source.

For example, the Huygens surface may be cubical, cuboidal, cylindrical, circular-cylindrical, or spherical. However, the Huygens surface may have any other surface geometry, i.e. the surface geometry may be arbitrarily complex.

According to another aspect of the present disclosure, the equivalent source comprises, for example, at least one equivalent electric current and/or at least one equivalent magnetic current. In general, the at least one equivalent electric current and the at least one equivalent magnetic current are determined such that electromagnetic waves emitted by these currents are the same as electromagnetic waves emitted by the device under test. In other words, the at least one equivalent electric current and the at least one equivalent magnetic current serve as model parameters for the simulation of the interaction of the device under test with the scattering object.

In an embodiment of the present disclosure, electromagnetic waves generated by the equivalent source are simulated by the simulation circuit. In general, the equivalent source is a mathematical representation of the device under test, such that the equivalent source transmits electromagnetic waves in the same way as the device under test. Thus, by simulating electromagnetic waves emitted by the equivalent source, transmitter properties of the device under test can be tested in the presence of the scattering object without having to perform the corresponding actual OTA measurements.

A further aspect of the present disclosure provides that scattering of the generated electromagnetic waves off the scattering object and off the Huygens box is simulated. Thus, a realistic electromagnetic interaction of the device under test, or rather of the electromagnetic waves generated by the device under test, with the scattering object is simulated by the methods disclosed herein, namely in terms of the scattering properties of the scattering object and of the device under test. This results in an increased accuracy of the simulations, and thus in an increased accuracy of the assessment of the performance of the device under test.

In some embodiments, multiple scattering is simulated. In other words, the (simulated) electromagnetic waves generated by the equivalent source may be scattered at the scattering object and at the Huygens box several times. Thus, a realistic simulation of the interactions between the device under test and the scattering object is provided. This is particularly important when the scattering object is located in a near-field region of the device under test.

Another aspect of the present disclosure provides that absorption of the generated electromagnetic waves by the scattering object and/or by the Huygens box is simulated. Thus, a realistic electromagnetic interaction of the device under test, or rather of the electromagnetic waves generated by the device under test, with the scattering object is simulated by at least one method disclosed herein, namely in terms of the absorption properties of the scattering object and/or of the device under test. This results in an increased accuracy of the conducted simulations, and thus in an increased accuracy of the assessment of the performance of the device under test.

In an embodiment of the present disclosure, the scattering object is located in a near-field region of the equivalent source. Accordingly, the interactions of the device under test with the scattering object being present in the near-field region of the device under test are simulated. Thus, the performance and other properties of the device under test in the near-field region can be tested by at least one method disclosed herein.

In a further embodiment of the present disclosure, the material properties comprise at least one of dielectric permittivity, magnetic permeability, and conductivity. However, it is to be understood that any other material property that is relevant for the reflection and/or absorption of electromagnetic waves may be assigned to the Huygens box and may thus be simulated.

Another aspect of the present disclosure provides that the material properties assigned to the Huygens box match, for example, the material properties of the device under test. Thus, the simulated Huygens box exhibits very similar or even the same reflection and/or absorption properties as the actual device under test. Thus, a particularly realistic simulation of the electromagnetic interactions between the device under test and the scattering object is provided.

In a further embodiment of the present disclosure, the Huygens box is divided into a plurality of portions, wherein different material properties are assigned to different portions of the Huygens box. Usually, the device under test comprises different components that consist of different materials, such that the different components have different electromagnetic properties with respect to absorption and reflection of electromagnetic waves. By assigning different material properties to different portions of the Huygens box, this internal structure of the device under test can be correctly simulated.

According to an aspect of the present disclosure, the equivalent source is determined based on, for example, the Love condition. The Love condition is per se well known in the field of electrodynamics. In general, the Love condition allows to have null fields inside the source volume, i.e. in the Huygens box. Therefore, any change of material properties of the equivalent source, i.e. the assignment of material properties to the Huygens box, has no impact on the free-space radiation of the equivalent source.

In other words, on the outside of the Huygens box, the electromagnetic waves generated by the equivalent source are not affected by the material properties assigned to the inside of the Huygens box. Thus, the simulated radiation properties of the device under test remain unaltered, while the simulated reflection and/or absorption properties are altered as intended by assigning the material properties to the Huygens box.

According to another aspect of the present disclosure, the at least one radiation parameter comprises, for example, at least one of an amplitude of electromagnetic waves emitted by the device under test and a phase of electromagnetic waves emitted by the device under test. Thus, the equivalent source may be determined such that the equivalent source generates electromagnetic waves matching the amplitude(s) and phase(s) determined.

Electromagnetic waves emitted by the device under test may be measured by at least one measurement probe in order to determine the at least one radiation parameter. For example, amplitudes and/or phases of the electromagnetic waves emitted by the device under test may be determined by the at least one measurement probe.

The at least one measurement probe may be established as a suitable radio frequency (RF) antenna that is configured to receive the electromagnetic waves generated by the device under test.

A further aspect of the present disclosure provides that the electromagnetic waves are measured, for example, in a near-field region of the device under test. Thus, the at least one measurement probe is placed in the near-field region of the device under test in order to measure the electromagnetic waves. Accordingly, the equivalent source may be determined based on the measurements conducted in the near-field region of the device under test.

Alternatively, the electromagnetic waves may be measured in a far-field region of the device under test and/or in the transition zone between the near-field region and the far-field region. The near-field properties of the electromagnetic waves emitted by the device under test can be reconstructed by appropriate mathematical transformations, for example by any suitable technique known in the state of the art.

In some embodiments, the device under test is placed in an anechoic chamber, wherein the electromagnetic waves are measured in the anechoic chamber. Thus, the electromagnetic waves emitted by the device under test can be measured without any external radiation that could disturb the measurements. Thus, the equivalent source can be determined with high precision.

The device under test may be a base station or a mobile communication device. For example, the device under test may be a 5G base station or a base station for satellite communication. As another example, the device under test may be a smartphone, a tablet, a Wi-Fi-router, a vehicle communication system, or a mobile radio.

However, it is to be understood that the methods according to various embodiments of the present disclosure are suitable for any electronic device that is configured for wireless communication and that can be tested over the air.

Embodiments of the present disclosure further provide a hybrid over-the-air (OTA) test system. In an embodiment, the hybrid OTA test system comprises at least one measurement probe, an analysis circuit, and a simulation circuit. The at least one measurement probe is configured (e.g., includes circuitry) to measure electromagnetic waves emitted by a device under test. The analysis circuit is configured to determine at least one radiation parameter based on the measured electromagnetic waves, wherein the at least one radiation parameter is associated with the electromagnetic waves emitted by the device under test. The simulation circuit is configured to determine an equivalent source on a Huygens surface based on the at least one determined radiation parameter, wherein the equivalent source is associated with the device under test. The simulation circuit is configured to assign material properties to a Huygens box confined by the Huygens surface, wherein the material properties are associated with at least one of reflection of electromagnetic waves and absorption of electromagnetic waves. The simulation circuit is configured to simulate an electromagnetic interaction between the device under test and the scattering object based on the determined equivalent source and based on the assigned material properties, thereby simulating an effect of interactions between a device under test and a scattering object.

In some embodiments, the hybrid OTA test system is configured to perform one or more of, or all of, the methods of simulating an effect of interactions between a device under test and a scattering object described above.

Regarding the further advantages and properties of the hybrid OTA test systems, reference is made to the explanations given above with respect to the methods, which also hold for the hybrid OTA test systems and vice versa.

According to an aspect of the present disclosure, the hybrid OTA test system comprises, for example, an anechoic chamber, wherein the anechoic chamber comprises the at least one measurement probe and a DUT holder, wherein the DUT holder is configured to hold the device under test.

In general, the anechoic chamber is configured to shield an interior space of the anechoic chamber from external electromagnetic waves. Thus, if the device under test is placed in the anechoic chamber, measurements can be performed with high precision due to the absence of external radiation.

The DUT holder may be configured to adapt a location and/or an orientation of the device under test, such that the device under test can be tested in a plurality of different locations and/or orientations.

According to another aspect of the present disclosure, the at least one measurement probe is located, for example, in a near-field region of the device under test. Accordingly, the equivalent source may be determined based on the measurements conducted in the near-field region of the device under test.

Alternatively, the at least one measurement probe may be located in a far-field region of the device under test or in a transition zone between the near-field region and the far-field region. Thus, the electromagnetic waves emitted by the device under test may be measured in a far-field region of the device under test and/or in the transition zone. The analysis circuit may be configured to reconstruct near-field properties of the electromagnetic waves emitted by the device under test by appropriate mathematical transformations, for example by any suitable technique known in the state of the art.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIGS. 3A, 3B, and 3C show diagrams illustrating individual steps of the method of FIG. 2.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
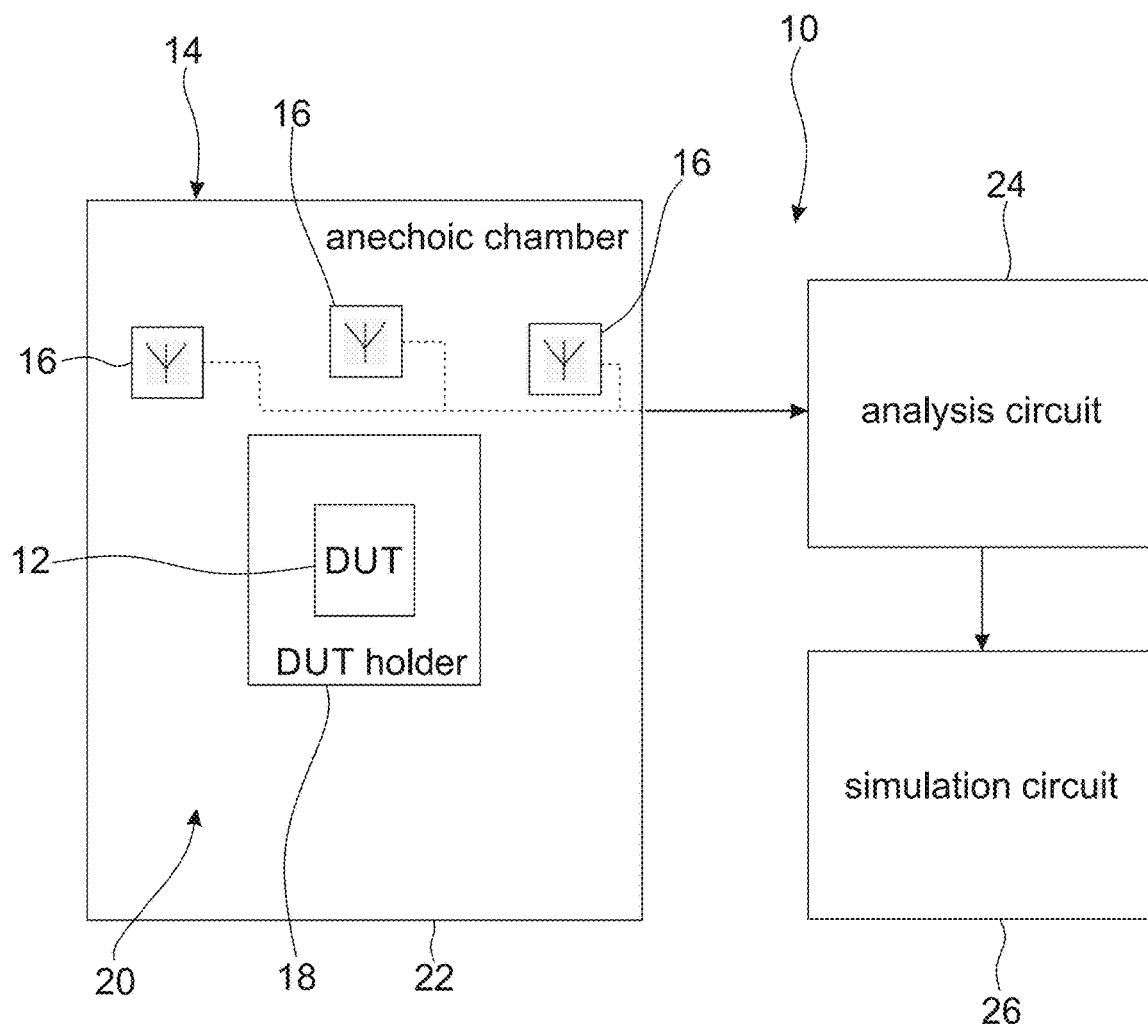
FIG. 1 schematically shows a hybrid over-the-air test (OTA) system according to an embodiment of the present disclosure.

FIG. 1 schematically shows a hybrid over-the-air (OTA) test system 10. In general, the hybrid OTA test system 10 is configured to perform OTA measurements on a device under test 12. The hybrid OTA test system 10 is further configured perform simulations of interactions of the device under test 12 with objects in the environment of the device under test 12 based on the performed OTA measurements, as will be described in more detail below. Further, the hybrid OTA test system 10 is configured to assess the performance of the device under test 12 based on the OTA measurements and based on the simulations.

The device under test 12 may be any electronic device that is configured for wireless communication. In some embodiments, the device under test 12 may be a base station or a mobile communication device. For example, the device under test 12 may be a 5G base station or a base station for satellite communication. As another example, the device under test 12 may be a smartphone, a tablet, a Wi-Fi-router, a vehicle communication system, a mobile radio, etc.

In some embodiments, the hybrid OTA test system 10 comprises an anechoic chamber 14, wherein the anechoic chamber 14 comprises at least one measurement probe 16 and a DUT holder 18. For example, the at least one measurement probe 16 and the DUT holder 18 are provided in an interior space 20 of the anechoic chamber 14, wherein the interior space 20 is confined by a housing 22 of the anechoic chamber 14. In the particular example shown in FIG. 1, the anechoic chamber 14 comprises three measurement probes 16. However, it is to be understood that the anechoic chamber may comprise any other number of measurement probes 16.

The housing 22 is configured to shield the interior space 20 from external electromagnetic waves, such that no external electromagnetic waves can propagate into the interior space 20 when the housing 22 is closed.

The DUT holder 18 is configured to hold the device under test 12 in a predefined location within the interior space 20. Moreover, the DUT holder 18 is configured to hold the device under test 12 with a predefined orientation. The DUT holder 18 may further be configured to adapt the location and/or orientation of the device under test 12 within the interior space 20.

The at least one measurement probe 16 includes circuitry configured to receive electromagnetic waves generated by the device under test 12. Optionally, the at least one measurement probe 16 may further include circuitry configured to transmit electromagnetic waves to the device under test 12.

The at least one measurement probe 16 may be placed in a near-field region of the device under test 12, such that near-field measurements can be performed by the measurement probe 16. Alternatively, the at least one measurement probe 16 may be placed in a far-field region of the device under test 12 or in a transition zone between the near-field region and the far-field region of the device under test 12. Optionally, the at least one measurement probe 16 may be movable between different measurement positions in the near-field region, in the far-field region, and/or in the transition zone. In some embodiments, any suitable device, such as a linear and/or angular stage, robotic apparatus, etc., may be utilized to move the probe 16. In other embodiments, the probe 16 is moved in a manual manner.

The hybrid OTA test system 10 further comprises an analysis circuit 24 that is connected to the at least one measurement probe 16 in a signal-transmitting manner. Further, the hybrid OTA test system 10 comprises a simulation circuit 26 that is connected to the analysis circuit 22 in a signal-transmitting manner Therein and in the following, the term "connected in a signal transmitting manner" is understood to denote a cable-based or wireless connection that is configured to transmit signals between the respective devices or components.

The analysis circuit 24 and the simulation circuit 26 may be established separately from each other, as is illustrated in FIG. 1. However, the analysis circuit 24 and the simulation circuit 26 may also be integrated into a common circuit or into a common electronic device.

For example, a measurement instrument, such as an oscilloscope, a signal analyzer or a spectrum analyzer, may be provided. The measurement instrument may comprise the analysis circuit 24 and/or the simulation circuit 26. Alternatively or additionally, the analysis circuit 24 and/or the simulation circuit may be integrated into a computing device with suitable software, such as a personal computer, a MAC, a laptop, a notebook, a smartphone, a tablet, or any other type of smart device.

Figure 2:
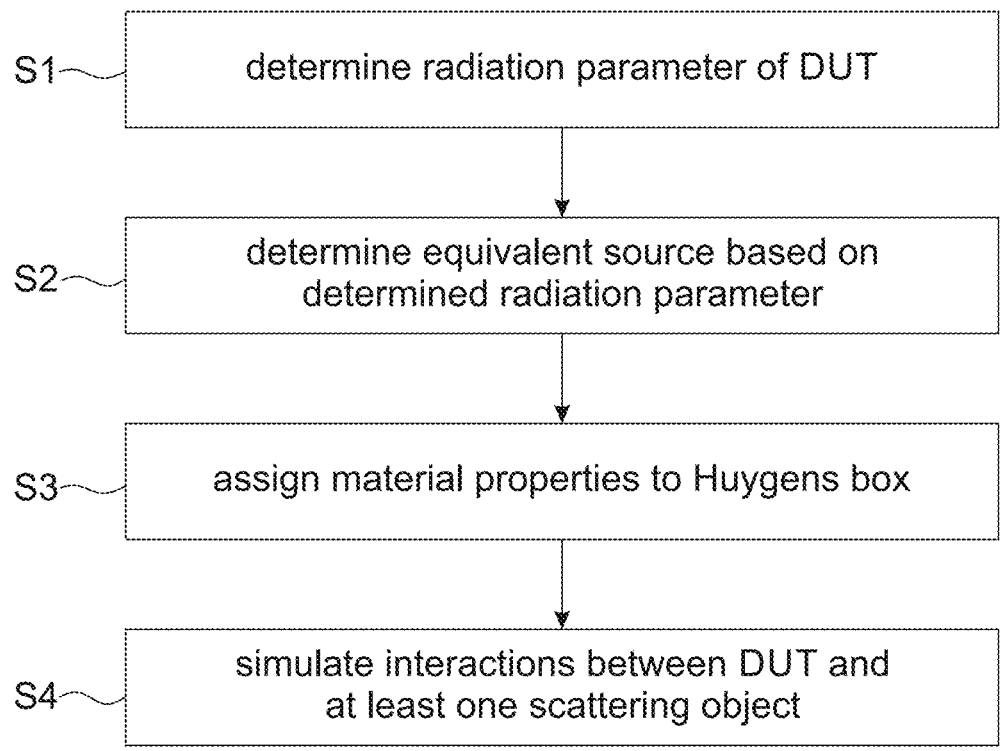
FIG. 2 shows a flow chart of a representative method of simulating an effect of interactions between a device under test and a scattering object by the hybrid OTA test system of FIG. 1 according to an embodiment of the present disclosure.

The hybrid OTA test system 10 is configured to perform a method of simulating an effect of interactions between a device under test 12 and a scattering object, an example of which is described in the following with reference to FIG. 2.

At least one radiation parameter of the device under test 12 is determined by the analysis circuit (step S1). In general, the at least one radiation parameter is associated with electromagnetic waves emitted by the device under test 12. For example, electromagnetic waves emitted by the device under test 12 are received via the at least one measurement probe 16, and a corresponding measurement signal is forwarded to the analysis circuit 24.

The analysis circuit 24 analyzes the received electromagnetic waves in order to determine the at least one radiation parameter. Thus, the at least one radiation parameter is determined based on an actual OTA measurement of the device under test 12.

The at least one radiation parameter may comprise at least one of an amplitude of electromagnetic waves emitted by the device under test 12 and a phase of electromagnetic waves emitted by the device under test 12. However, the at least one radiation parameter may comprise any other physical quantity that describes transmission properties of the device under test, e.g. a radiated power, a radiated power density, an angular distribution of the radiated power, a Poynting vector, etc.

As is illustrated in FIG. 3A, a vector field measurement may be performed, such that the at least one radiation parameter describes a vector field of electromagnetic fields emitted by the device under test 12.

An equivalent source 28 is determined by the simulation circuit 26 based on the at least one determined radiation parameter (step S2). As is illustrated in FIG. 3B, the equivalent source 28 comprises at least one equivalent electric current and/or at least one equivalent magnetic current on a Huygens surface 30. The equivalent source 28, i.e. the at least one equivalent electric current and/or the at least one equivalent magnetic current, is a mathematical object that may be determined based on a physical model of the device under test 12.

In general, the equivalent source 28 is determined such that (simulated) electromagnetic waves emitted by the equivalent source 28 are the same as the actual electromagnetic waves emitted by the device under test 12, at least in a region outside of the device under test 12, i.e. in a region outside of a Huygens box 32 confined by the Huygens surface 30.

The equivalent source 28 may be determined based on the Love condition. The Love condition is per se well known in the field of electrodynamics. In general, the Love condition allows to have null fields inside the source volume, i.e. in the Huygens box 32.

Therefore, any change of material properties of the Huygens box 32, i.e. the assignment of material properties to the Huygens box 32 as described below, has no impact on the free-space radiation of the equivalent source 28. In other words, on the outside of the Huygens box 32, the electromagnetic waves generated by the equivalent source 28 are not affected by material properties of the Huygens box 32.

The Huygens surface 30 has a defined arbitrary surface geometry. In some embodiments, the Huygens surface 30 is a surface that is closely surrounding the device under test 12.

In some embodiments, the Huygens surface 30 may have a similar shape or the same shape as an outer surface of the device under test 12. Thus, the Huygens surface 30 may closely resemble the shape of the device under test 12. For example, the Huygens surface 30 may be cubical, cuboidal, cylindrical, circular-cylindrical, or spherical. However, the Huygens surface 30 may have any other surface geometry, i.e. the surface geometry may be arbitrarily complex.

Material properties are assigned to the Huygens box 32 by the simulation circuit 26 (step S3). In general, the material properties are associated with reflection of electromagnetic waves and/or absorption of electromagnetic waves by the Huygens box 32. For example, the material properties comprise a dielectric permittivity, a magnetic permeability, and/or a conductivity of the Huygens box 32.

However, it is to be understood that any other material property that is relevant for the reflection and/or absorption of electromagnetic waves may be assigned to the Huygens box 32 and may thus be simulated. For example, the material properties assigned to the Huygens box 32 may correspond to a perfect reflector, i.e. the Huygens box 32 reflects all electromagnetic waves impinging on the Huygens box 32.

As another example, the material properties assigned to the Huygens box 32 may correspond to a perfect absorber, i.e. the Huygens box 32 absorbs all electromagnetic waves impinging on the Huygens box 32. As a further example, the material properties assigned to the Huygens box 32 are such that the Huygens box 32 partially reflects and partially absorbs electromagnetic waves impinging on the Huygens box 32.

The material properties assigned to the Huygens box 32 may match the corresponding material properties of the device under test 12, such that the simulated Huygens box 32 exhibits very similar or even the same reflection and/or absorption properties as the actual device under test 12.

The device under test 12 usually has an internal structure with different components consisting of different materials. Thus, the different components may have different material properties. Thus, the Huygens box 32 may be divided into a plurality of different portions, wherein different material properties are assigned to the different portions of the Huygens box 32. Accordingly, the internal structure of the device under test 12 may be resembled by the different portions of the Huygens box 32.

As already mentioned above, assigning the material properties to the Huygens box 32 or to the different portions of the Huygens box does not affect the transmission of electromagnetic waves generated by the equivalent source 28 outside of the Huygens box 32, because the equivalent source 28 has been determined based on the Love condition.

Interactions between the device under test 12 and at least one scattering object 34 are simulated by the simulation circuit 26 based on the determined equivalent source and based on the assigned material properties (step S4).

In general, the at least one scattering object 34 may be any object in the environment of the device under test 12. For example, the scattering object 34 may be a car or another vehicle, certain components of a car or of another vehicle, a tree or other plants, a building, a mountain, etc. As a further example, the scattering object may correspond to biological material. For example, the scattering object may be a human or a certain body part of a human, for example a human head.

The scattering object 34 may also be called "phantom", as is shown in FIG. 3C.

Due to the material properties assigned to the Huygens box 32, a full simulation of the interaction of the equivalent source 28 (i.e. of the device under test 12) with the at least one scattering object 34 can be performed.

For example, the simulation may be performed as explained hereinafter. Electromagnetic waves generated by the equivalent source 28 are simulated. In other words, the equivalent source 28 generates electromagnetic waves within the simulation. The electromagnetic waves generated by the equivalent source impinge on the at least one scattering object 34. Based on material properties of the at least one scattering object 34, the electromagnetic waves are partially absorbed and partially reflected. In some embodiments, the electromagnetic waves are partially reflected back to the Huygens box 32.

The electromagnetic waves reflected back to the Huygens box 32 are again partially absorbed and partially reflected based on the material properties assigned to the Huygens box 32. Thus, multiple scattering of the electromagnetic waves generated by the equivalent source 28 off the at least one scattering object 34 and off the Huygens box 32 can be simulated.

With the method described above, the precision of simulations of the interactions between the device under test 12 and the at least one scattering object 34 can be enhanced significantly, for example if the at least one scattering object 34 is located in a near-filed region of the device under test 12, where multiple scattering becomes important. For example, with the method described above, the electromagnetic exposure of a person standing nearby a low-power indoor cell can be evaluated with high precision based on the OTA measurements described above, without actually exposing a human being to the electromagnetic waves.

Thus, in this example, the device under test 12 is the low-power indoor cell, and the at least one scattering object 34 is a human being. The method described above allows for a more realistic simulation and thus more precise assessment of the radiation energy absorbed by the human being.

As another example, the performance of an antenna that is integrated behind a dashboard in a car can be assessed with significantly enhanced precision by the method described above. In this example, the device under test 12 is the antenna, and the at least one scattering object 34 is the dashboard of the car.

However, it is to be understood that any type of electronic device configured for wireless communication can be tested in a defined arbitrary environment by the method described above.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

Some embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Some of the embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented at least in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform (e.g., are configured to carry out) the specified functions or operations, or combinations of special purpose hardware and computer instructions.

According to some embodiments, many individual steps of a process may or may not be carried out utilizing computer or computing based systems described herein, and the degree of computer implementation may vary, as may be desirable and/or beneficial for one or more particular applications.

Of course, in some embodiments, two or more of components described above, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed. The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of simulating an effect of interactions between a device under test and a scattering object by a hybrid over-the-air (OTA) test system, wherein the hybrid OTA test system comprises an analysis circuit and a simulation circuit, the method comprising the steps of:
determining, by the analysis circuit, at least one radiation parameter of the device under test, wherein the at least one radiation parameter is associated with electromagnetic waves emitted by the device under test;
determining, by the simulation circuit, an equivalent source on a Huygens surface based on the at least one determined radiation parameter, wherein the equivalent source is associated with the device under test;
assigning, by the simulation circuit, material properties to a Huygens box confined by the Huygens surface, wherein the material properties are associated with at least one of reflection of electromagnetic waves and absorption of electromagnetic waves; and
simulating, by the simulation circuit, an electromagnetic interaction between the device under test and the scattering object based on the determined equivalent source and based on the assigned material properties, thereby simulating an effect of interactions between the device under test and the scattering object.

2. The method of claim 1, wherein the Huygens surface has a defined arbitrary surface geometry.

3. The method of claim 1, wherein the equivalent source comprises at least one equivalent electric current and/or at least one equivalent magnetic current.

4. The method of claim 1, wherein electromagnetic waves generated by the equivalent source are simulated by the simulation circuit.

5. The method of claim 4, wherein scattering of the generated electromagnetic waves off the scattering object and off the Huygens box is simulated.

6. The method of claim 5, wherein multiple scattering is simulated.

7. The method of claim 4, wherein absorption of the generated electromagnetic waves by the scattering object and/or by the Huygens box is simulated.

8. The method of claim 1, wherein the scattering object is located in a near-field region of the equivalent source.

9. The method of claim 1, wherein the material properties comprise at least one of dielectric permittivity, magnetic permeability, or conductivity.

10. The method of claim 1, wherein the material properties assigned to the Huygens box match material properties of the device under test.

11. The method of claim 1, wherein the Huygens box is divided into a plurality of portions, and wherein different material properties are assigned to different portions of the Huygens box.

12. The method of claim 1, wherein the equivalent source is determined based on the Love condition.

13. The method of claim 1, wherein the at least one radiation parameter comprises at least one of an amplitude of electromagnetic waves emitted by the device under test or a phase of electromagnetic waves emitted by the device under test.

14. The method of claim 1, wherein the electromagnetic waves emitted by the device under test are measured by at least one measurement probe in order to determine the at least one radiation parameter.

15. The method of claim 14, wherein the electromagnetic waves are measured in a near-field region of the device under test.

16. The method of claim 14, wherein the device under test is placed in an anechoic chamber, and wherein the electromagnetic waves are measured in the anechoic chamber.

17. The method of claim 1, wherein the device under test is a base station or a mobile communication device.

18. A hybrid over-the-air (OTA) test system, the hybrid OTA test system comprising:
at least one measurement probe configured to measure electromagnetic waves emitted by a device under test;

an analysis circuit configured to determine at least one radiation parameter based on the measured electromagnetic waves, wherein the at least one radiation parameter is associated with the electromagnetic waves emitted by the device under test; and a simulation circuit configured to determine an equivalent source on a Huygens surface based on the at least one determined radiation parameter, wherein the equivalent source is associated with the device under test, wherein the simulation circuit is also configured to assign material properties to a Huygens box confined by the Huygens surface, wherein the material properties are associated with at least one of reflection of electromagnetic waves and absorption of electromagnetic waves, and wherein the simulation circuit is further configured to simulate an electromagnetic interaction between the device under test and the scattering object based on the determined equivalent source and based on the assigned material properties, thereby simulating an effect of interactions between a device under test and a scattering object.

19. The hybrid OTA test system of claim 18, wherein the hybrid OTA test system comprises an anechoic chamber, wherein the anechoic chamber comprises the at least one measurement probe and a DUT holder, wherein the DUT holder is configured to hold the device under test.

20. The hybrid OTA test system of claim 18, wherein the at least one measurement probe is located in a near-field region of the device under test.

* * * * *